(12) United States Patent
Tanaka

(10) Patent No.: US 10,788,510 B2
(45) Date of Patent: Sep. 29, 2020

(54) PHYSICAL QUANTITY SENSOR, ELECTRONIC DEVICE, AND VEHICLE

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 213 days.

(21) Appl. No.: 15/924,805

(22) Filed: Mar. 19, 2018

(65) Prior Publication Data

US 2018/0275163 A1 Sep. 27, 2018

(30) Foreign Application Priority Data

Mar. 27, 2017 (JP) ................. 2017-061701

(51) Int. Cl.
*G01P 15/125* (2006.01)
*G01P 15/08* (2006.01)
*B81B 3/00* (2006.01)
(52) U.S. Cl.
CPC .......... *G01P 15/125* (2013.01); *B81B 3/0018* (2013.01); *G01P 15/0802* (2013.01); *B81B 2201/0235* (2013.01); *B81B 2203/04* (2013.01); *G01P 2015/0831* (2013.01); *G01P 2015/0871* (2013.01)
(58) Field of Classification Search
CPC ............... G01P 15/125; G01P 15/0802; G01P 2015/0831; G01P 2015/0871; B81B 3/0018; B81B 2201/0235; B81B 2203/04; G01C 19/5733; G01C 19/5769
See application file for complete search history.

(56) References Cited

U.S. PATENT DOCUMENTS 6,230,567 B1 * 5/2001 Greiff .................... G01P 1/006
73/514.37
2003/0115960 A1 6/2003 Franz et al.
(Continued)

FOREIGN PATENT DOCUMENTS

EP  2 175 280 A1   4/2010
JP  2003-519384 A  6/2003
(Continued)

OTHER PUBLICATIONS

Extended European Search Report for Application No. EP 18 16 3898 dated Jun. 28, 2018 (7 pages).

*Primary Examiner* — Lisa M Caputo
*Assistant Examiner* — Nigel H Plumb
(74) *Attorney, Agent, or Firm* — Harness, Dickey & Pierce, P.L.C.

(57) ABSTRACT

A physical quantity sensor includes a substrate; a movable body that is displaceable about a support axis according to a physical quantity and includes an opening; a support that is provided on the substrate and is located in the opening, and the support includes a first fixed plate and a second fixed plate that are fixed to the substrate and provided so as to sandwich the support axis in plan view; a first beam and a second beam that each connect the first fixed plate with the second fixed plate and are spaced apart from each other; a third beam extending in a direction of the support axis and connecting the first beam with the movable body; and a fourth beam extending in a direction of the support axis and connecting the second beam with the movable body.

20 Claims, 13 Drawing Sheets

(56) References Cited

U.S. PATENT DOCUMENTS

| | | | |
|---|---|---|---|
| 2005/0009109 A1 | 1/2005 | Moerner et al. | |
| 2005/0139942 A1 | 6/2005 | Eskridge et al. | |
| 2008/0053224 A1* | 3/2008 | Tsuji | G01C 19/5719 |
| | | | 73/504.12 |
| 2010/0089154 A1* | 4/2010 | Ballas | B81B 3/0078 |
| | | | 73/493 |
| 2012/0186347 A1 | 7/2012 | McNeil | |
| 2015/0040667 A1 | 2/2015 | Tanaka | |
| 2015/0316582 A1* | 11/2015 | Tanaka | B81B 3/0051 |
| | | | 73/514.32 |
| 2016/0047839 A1 | 2/2016 | Tanaka | |
| 2016/0209442 A9 | 7/2016 | Tanaka | |

FOREIGN PATENT DOCUMENTS

| | | |
|---|---|---|
| JP | 2012-181030 A | 9/2012 |
| JP | 2015-031644 A | 2/2015 |
| JP | 2015-031645 A | 2/2015 |
| JP | 5852437 B | 2/2016 |
| JP | 2016-044979 A | 4/2016 |

\* cited by examiner

PHYSICAL QUANTITY SENSOR, ELECTRONIC DEVICE, AND VEHICLE

BACKGROUND

1. Technical Field

The present invention relates to a physical quantity sensor, an electronic device, and a vehicle.

2. Related Art

In recent years, a physical quantity sensor measuring a physical quantity such as acceleration has been developed using, for example, a silicon micro electro mechanical systems (MEMS) technique.

For example, JP-A-2012-181030 discloses a capacitance type acceleration sensor including a fixed electrode fixed to a substrate, a movable electrode disposed so as to face a top surface of the fixed electrode, and an elastic support elastically supporting the movable electrode so as to be displaceable in a direction orthogonal to the top surface of the substrate, the elastic support includes a support fixed to the substrate, and a beam connecting the support with the movable electrode.

However, in the acceleration sensor described in JP-A-2012-181030, if a strong impact is applied in a direction (a Z-axis direction) orthogonal to the top surface of a substrate, there is a possibility of breaking the beam.

SUMMARY

An advantage of some aspects of the invention is to provide a physical quantity sensor in which a possibility of breaking a beam can be reduced.

Another advantage of some aspects of the invention is to provide an electronic device including the physical quantity sensor.

Another advantage of some aspects of the invention is to provide a vehicle including the physical quantity sensor.

The invention can be implemented as the following forms or application examples.

Application Example 1

A physical quantity sensor according to this application example includes a substrate; a movable body that is displaceable about a support axis according to a physical quantity and is provided with an opening; and a support that is provided on the substrate and is located in the opening, the support includes a first fixed plate and a second fixed plate that are fixed to the substrate and provided so as to sandwich the support axis in plan view; a first beam and a second beam that each connect the first fixed plate with the second fixed plate and are spaced apart from each other; a third beam extending in a direction of the support axis and connecting the first beam with the movable body; and a fourth beam extending in a direction of the support axis and connecting the second beam with the movable body.

In such a physical quantity sensor, in a case where a strong impact is applied in the Z-axis direction, the first beam and the second beam can be torsionally deformed. Thus, in the physical quantity sensor, in a case where a strong impact is applied in the Z-axis direction, it is possible to suppress stress concentration on the end on the first beam side of the third beam and the end on the second beam side of the fourth beam.

Therefore, in such a physical quantity sensor, the possibility of breaking the third beam and the fourth beam can be reduced.

Application Example 2

In the physical quantity sensor according to the application example, a shortest distance in a direction intersecting the direction of the support axis between the first fixed plate and the third beam may be shorter than a shortest distance in the intersecting direction between the first fixed plate and a connecting portion of the first beam to the third beam, and a shortest distance in the intersecting direction between the second fixed plate and the third beam may be shorter than a shortest distance between the second fixed plate and the connecting portion.

In such a physical quantity sensor, in the case of forming the movable body and the support by etching using inductive coupling method (ICP), the etching rate to form the third beam can be reduced.

Thus, the third beam can be formed with high accuracy.

Application Example 3

In the physical quantity sensor according to the application example, the first beam and the second beam may be displaceable about an axis intersecting the support axis.

In such a physical quantity sensor, in a case where a strong impact is applied in the Z-axis direction, the first beam and the second beam can be torsionally deformed about the axis intersecting the support axis.

Application Example 4

In the physical quantity sensor according to the application example, the movable body may include a fifth beam and a sixth beam extending a direction intersecting a direction of the support axis, the third beam may connect the first beam with the fifth beam, and the fourth beam may connect the second beam with the sixth beam.

In such a physical quantity sensor, in a case where a strong impact is applied in the Z-axis direction, the fifth beam and the sixth beam can be torsionally deformed. Thus, in such a physical quantity sensor, in a case where a strong impact is applied in the Z-axis direction, it is possible to reduce stress concentration on the end on the fifth beam side of the third beam and the end on the sixth beam side of the fourth beam.

Application Example 5

In the physical quantity sensor according to the application example, the fifth beam and the sixth beam may be displaceable about an axis intersecting the support axis.

In such a physical quantity sensor, in a case where a strong impact is applied in the Z-axis direction, the fifth beam and the sixth beam can be torsionally deformed about the axis intersecting the support axis.

Application Example 6

In the physical quantity sensor according to the application example, the support may include a first stopper protruding from the first fixed plate toward a side opposite to the third beam side in a direction intersecting the direction of the support axis, a shortest distance in the intersecting direction between the first stopper and the movable body may be shorter than a shortest distance in the intersecting direction between the second fixed plate and the third beam.

In such a physical quantity sensor, even if a strong impact is applied and the movable body and the third beam are displaced to the X-axis direction (in a direction intersecting the direction of the support axis), before the third beam collides with the second fixed plate, the movable body collides with the first stopper.

Therefore, in such a physical quantity sensor, the possibility of breaking the third beam can be reduced.

Application Example 7

In the physical quantity sensor according to the application example, the support may include a second stopper protruding from the first fixed plate toward the direction of the support axis, and a shortest distance in the direction of the support axis between the second stopper and the movable body may be shorter than a shortest distance in a direction intersecting the direction of the support axis between the first fixed plate and the third beam.

In such a physical quantity sensor, even if a strong impact is applied and the movable body and the third beam rotate counterclockwise about the Z axis, before the third beam collides with the first fixed plate, the movable body collides with the second stopper.

Therefore, in such a physical quantity sensor, the possibility of breaking the third beam can be reduced.

Application Example 8

An electronic device according to this application example includes the physical quantity sensor according to the application example, an arithmetic processor configured to perform an arithmetic process based on an output signal from the physical quantity sensor, and a display configured to display information according to control of the arithmetic processor.

Such an electronic device can include the physical quantity sensor according to the application example.

A portable electronic device according to an application example includes the physical quantity sensor according to the application example, an arithmetic processor configured to perform an arithmetic process based on an output signal from the physical quantity sensor, an interface configured to perform external data communication, an operator configured to transmit an operation signal to the arithmetic processor; and a display configured to display information according to control of the arithmetic processor.

A portable electronic device according to an application example includes a GPS receiver, and measures a movement distance and a movement trajectory of a user.

Application Example 9

A vehicle according to this application example includes the physical quantity sensor according to the application example.

A vehicle according to an application example includes at least one system of an engine system, a brake system, and a keyless entry system, and a controller configured to control the system, based on an output signal from the physical quantity sensor.

Such a vehicle can include the physical quantity sensor according to the application example.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments to be described below do not limit the contents of the invention described in the appended claims. Further, not all of the configurations described below are essential constituent elements of the invention.

1. Physical Quantity Sensor

Figure 1:
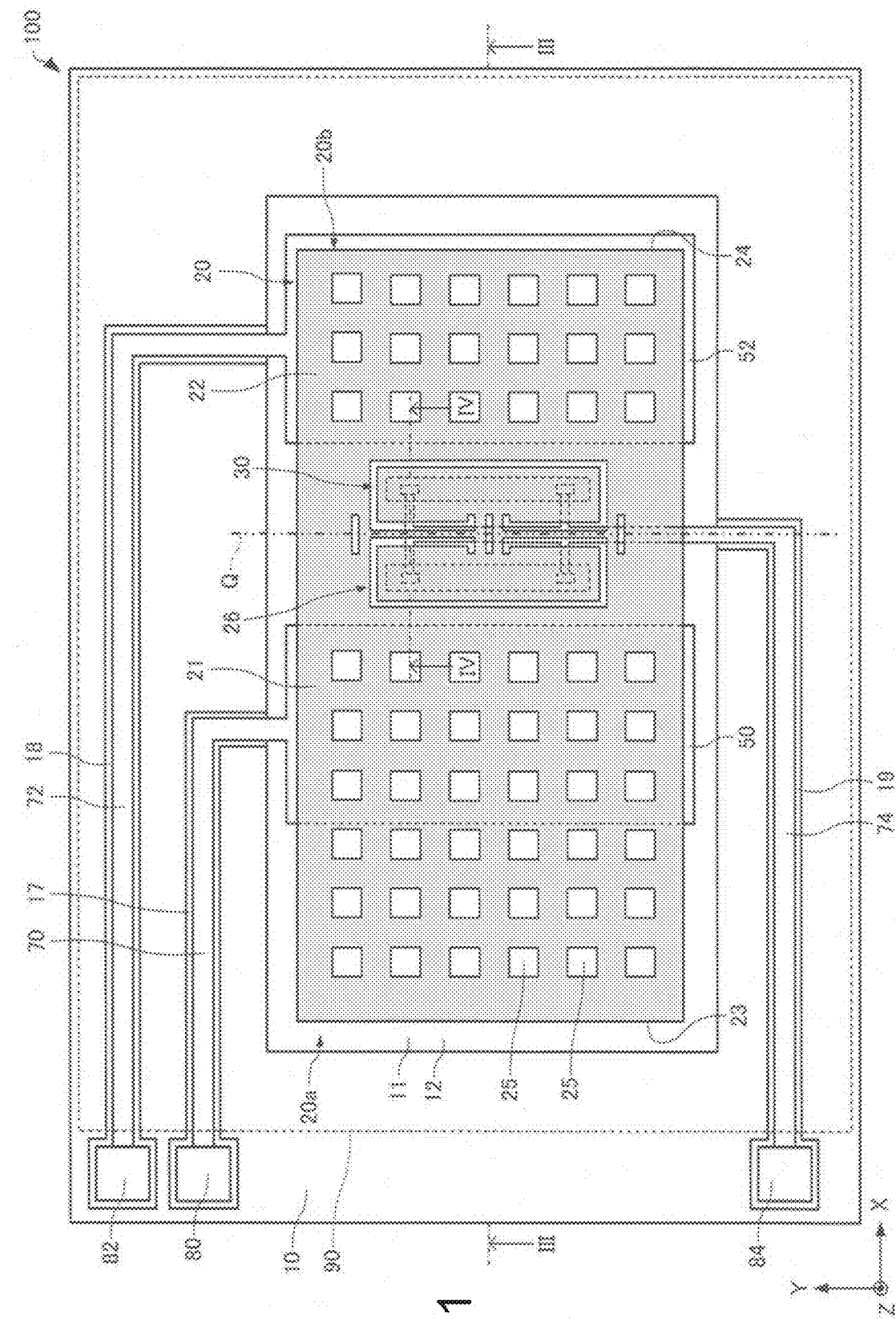
FIG. 1 is a plan view schematically illustrating a physical quantity sensor according to a present embodiment.
Figure 2:
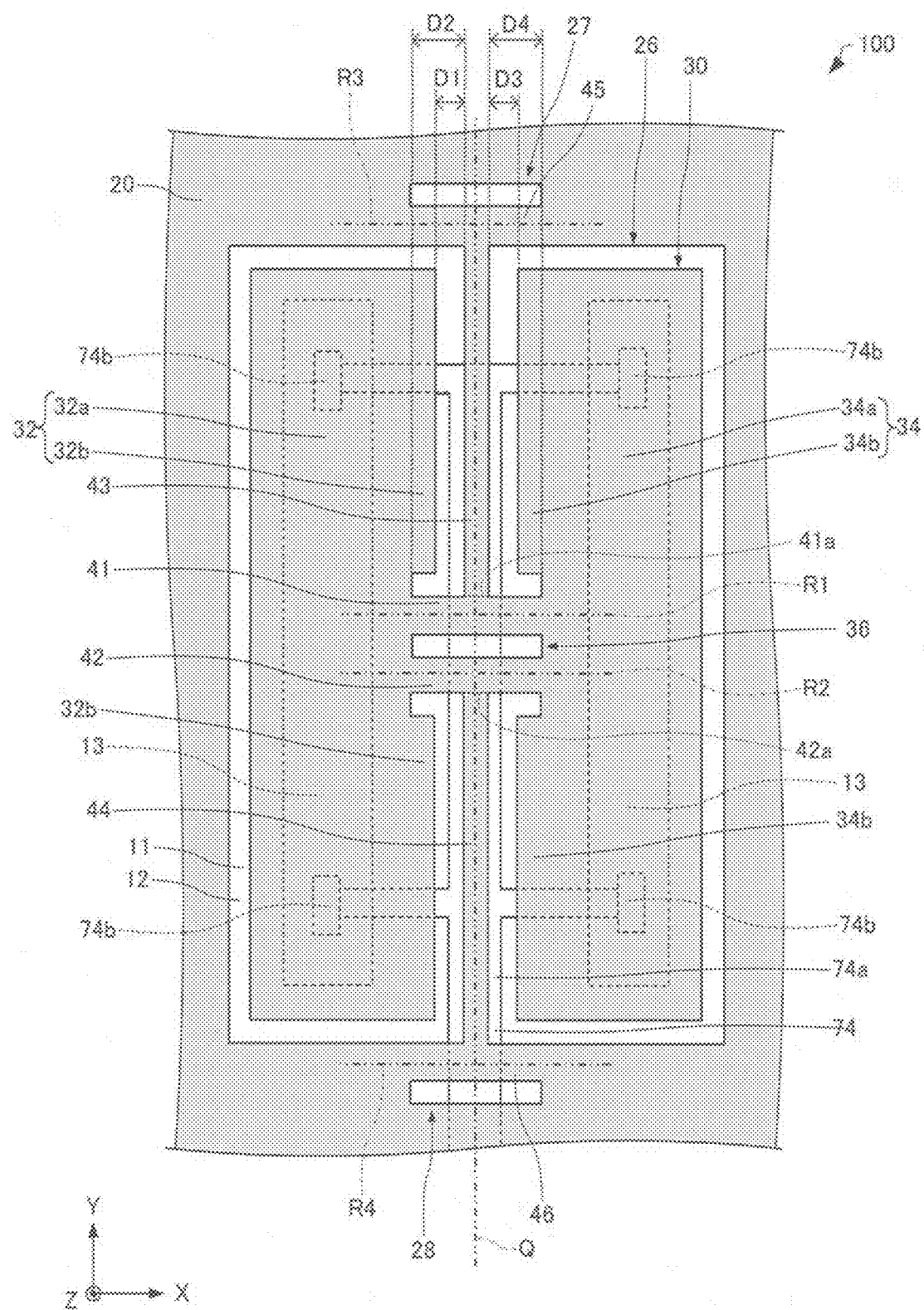
FIG. 2 is a plan view schematically illustrating the physical quantity sensor according to the present embodiment.
Figure 3:
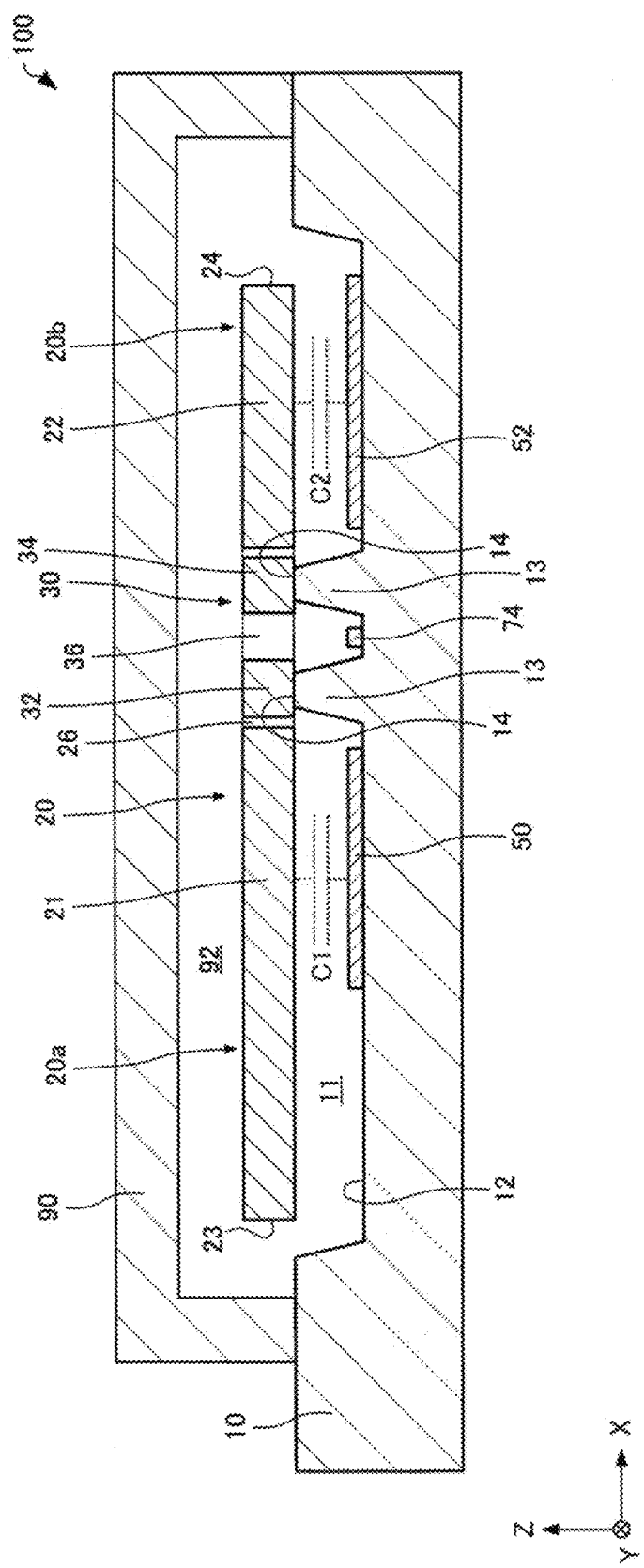
FIG. 3 is a cross-sectional view schematically illustrating the physical quantity sensor according to the present embodiment.
Figure 4:
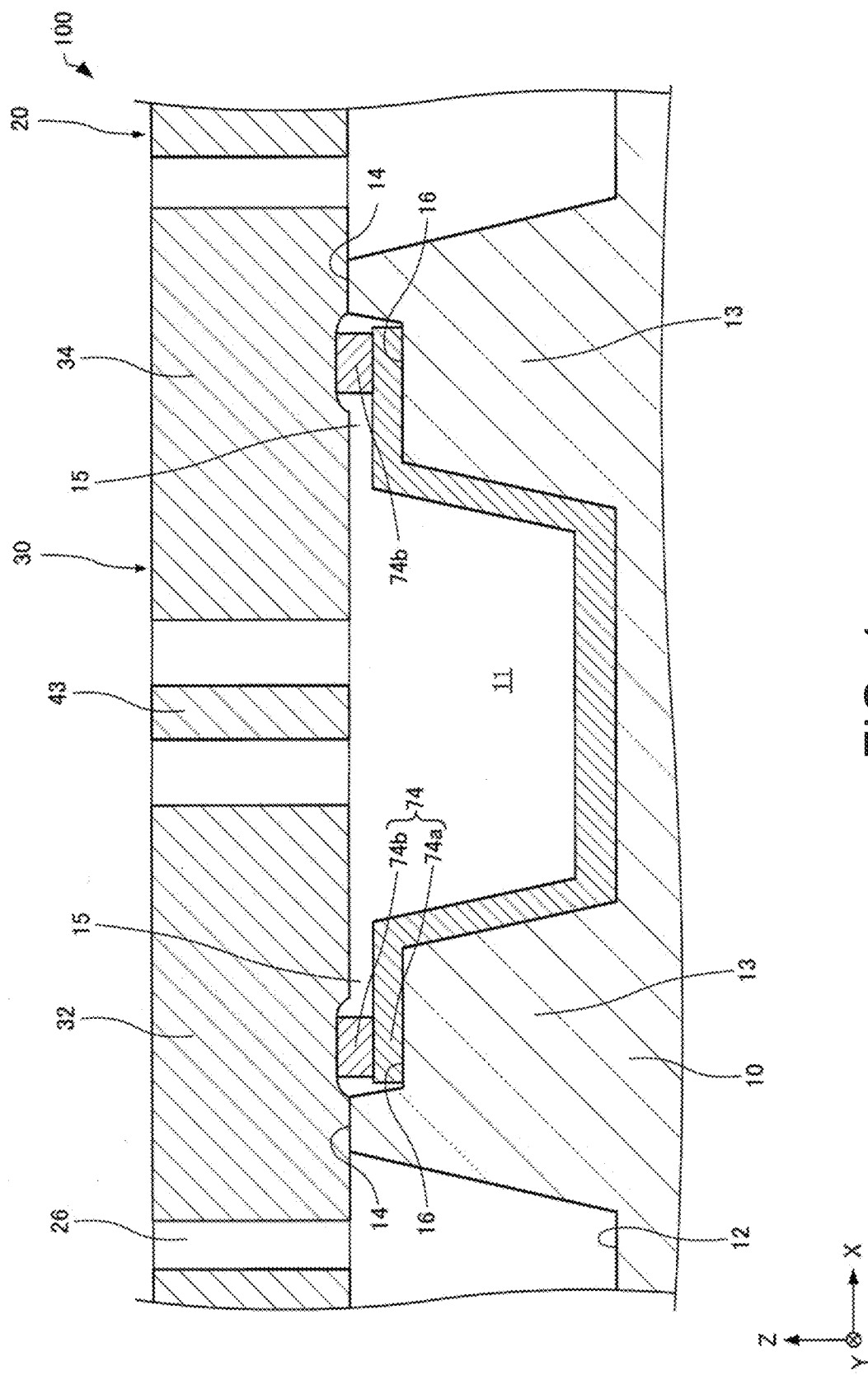
FIG. 4 is a cross-sectional view schematically illustrating the physical quantity sensor according to the present embodiment.

First, a physical quantity sensor according to a present embodiment will be described with reference to the drawings. FIG. 1 is a plan view schematically illustrating a physical quantity sensor 100 according to the present embodiment. FIG. 2 is an enlarged view of the periphery of a support 30 of the physical quantity sensor 100 according to the present embodiment. FIG. 3 is a cross-sectional view taken along a line III-III of FIG. 1 schematically illustrating the physical quantity sensor 100 according to the present embodiment. FIG. 4 is a cross-sectional view taken along a line IV-IV in FIG. 1 schematically illustrating the physical quantity sensor 100 according to the present embodiment. In FIG. 1 to FIG. 4, an X axis, a Y axis, and a Z axis are illustrated as three axes orthogonal to each other.

As illustrated in FIG. 1 to FIG. 4, the physical quantity sensor 100 includes a substrate 10, a movable body 20 (upper capacitor plate), a support 30, a first fixed electrode 50, a second fixed electrode 52, a first wiring 70, a second wiring 72, a third wiring 74, a first pad 80, a second pad 82, a third pad 84, and a lid 90. For the sake of convenience, FIG. 1 shows the lid 90 in phantom. In FIGS. 2 to 4, the illustration of the lid 90 is omitted.

In the following, an example will be described in which the physical quantity sensor 100 is an acceleration sensor (a capacitive MEMS acceleration sensor) that measures acceleration in the vertical direction (Z-axis direction).

The material of the substrate 10 is, for example, an insulating material such as glass. For example, since the substrate 10 is made of an insulating material such as glass and the movable body 20 is made of a semiconductor material such as silicon, it is possible to easily electrically insulate them from each other, and to simplify the sensor structure.

A recess 11 is formed in the substrate 10. The movable body 20 is provided above the recess 11 via gaps. In the example illustrated in FIG. 1, the planar shape (the shape seen from the Z-axis direction) of the recess 11 is a rectangle.

The substrate 10 includes a projection post (projection) 13 (pedestal support) upstanding from the bottom surface (the surface of the substrate 10 defining the recess 11) 12 of the recess 11. The post 13 is a projection protruding upward (+Z-axis direction) from the bottom surface 12. As illustrated in FIG. 3, the height of the post 13 (the distance between the top surface 14 and the bottom surface 12 of the post 13) and the depth of the recess 11 are equal, for example. The top surface 14 of the post 13 is bonded to the support 30. A hollow 15 is formed on the top surface 14 of the post 13, as illustrated in FIG. 4. A third wiring 74 is provided on the bottom surface 16 of the hollow 15 (the surface of the post 13 defining the bottom of the hollow 15).

In the example illustrated in FIG. 3 and FIG. 4, the side surface of the recess 11 (the side surface of the substrate 10 defining the recess 11) and the side surface of the post 13 are inclined with respect to the bottom surface 12 of the recess 11, but may be perpendicular relative to the bottom surface 12 if desired.

As illustrated in FIG. 1, the substrate 10 is provided with grooves 17, 18, and 19 in which wirings 70, 72, 74 are disposed respectively.

The movable body 20 is displaced in a direction (for example, a Z-axis direction) intersecting with the main surface of the substrate 10 according to a physical quantity (for example, acceleration). The movable body 20 is displaceable about the support axis Q according to the physical quantity. Specifically, when acceleration in the vertical direction (Z-axis direction) is applied, the movable body 20 swings like a seesaw (reciprocally pivots) with the support axis Q controlled by the beams 43 and 44 of the support 30 as the rotation axis (rocking axis). The support axis Q is, for example, parallel to the Y axis. In the example illustrated in FIG. 1, the planar shape of the movable body 20 is a rectangle. The thickness (size in the Z-axis direction) of the movable body 20 is, for example, constant.

The movable body 20 includes a first seesaw piece (first movable portion or first movable mass/plate) 20a and a second seesaw piece (first movable portion or second movable mass/plate) 20b.

The movable body 20 includes the first seesaw piece (first movable portion) 20a on one side in a direction orthogonal to the rotation axis, with the rotation axis as a boundary, the second seesaw piece (second movable portion) 20b on the other side of the orthogonal direction, a fifth beam 45 and a sixth beam 46 connecting the first seesaw piece (first movable portion) 20a with the second seesaw piece (second movable portion) 20b, an opening 26 is disposed, in plan view, between the fifth beam 45 and the sixth beam 46, a third beam 43 connects a first beam 41 and the fifth beam 45, and a fourth beam 44 connects a second beam 42 with the sixth beam 46. The first seesaw piece 20a is positioned on one side (on the −X-axis direction side in the illustrated example) of the support axis Q in plan view (viewed from the Z-axis direction). In plan view, the second seesaw piece 20b is positioned on the other side (on the +X-axis direction side in the illustrated example) of the support axis Q.

When acceleration (for example, gravitational acceleration) in the vertical direction is applied to the movable body 20, a rotational moment (moment of force) is generated in each of the first seesaw piece 20a and the second seesaw piece 20b. Here, in a case where the rotational moment of the first seesaw piece 20a (for example, the counterclockwise rotational moment) and the rotational moment of the second seesaw piece 20b (for example, the clockwise rotational moment) are balanced, the inclination of the movable body 20 does not change relative to the substrate 10 and acceleration cannot be measured. Therefore, the movable body 20 is designed so that when the acceleration in the vertical direction is applied, the rotational moment of the first seesaw piece 20a and the rotational moment of the second seesaw piece 20b are not balanced, and a predetermined inclination occurs in the movable body 20.

In the physical quantity sensor 100, by disposing the support axis Q at a position deviated from the center (the center of gravity) of the movable body 20 (by making the distances from the support axis Q to the distal ends of the seesaw pieces 20a and 20b different), the seesaw pieces 20a and 20b have different masses. That is, the movable body 20 has different masses on one side (first seesaw piece 20a) and the other side (second seesaw piece 20b), with the support axis Q as a boundary. In the illustrated example, the distance from the support axis Q to the end surface 23 of the first seesaw piece 20a is greater than the distance from the support axis Q to the end surface 24 of the second seesaw piece 20b. Further, the thickness of the first seesaw piece 20a is equal to the thickness of the second seesaw piece 20b. Therefore, the mass of the first seesaw piece 20a is larger than the mass of the second seesaw piece 20b.

In this way, since the seesaw pieces 20a and 20b have different masses, the rotational moment of the first seesaw piece 20a and the rotational moment of the second seesaw piece 20b can be made not balanced when the acceleration in the vertical direction is applied. Therefore, when the acceleration in the vertical direction is applied, a predetermined inclination can be generated in the movable body 20.

Although not shown, the support axis Q can be disposed at the center of the movable body 20 and the seesaw pieces 20a and 20b can be made different in thickness, such that the seesaw pieces 20a and 20b may have different masses. Even in such a case, when the acceleration in the vertical direction is applied, a predetermined inclination can occur in the movable body 20.

The movable body 20 is spaced apart from the substrate 10. The movable body 20 is provided above the recess 11.

A gap is provided between the movable body 20 and the substrate 10. Thus, the movable body 20 can swing like a seesaw.

The movable body 20 includes a first movable electrode 21 and a second movable electrode 22, which are separated with the support axis Q serving as a boundary. The first movable electrode 21 is provided in the first seesaw piece 20a. The second movable electrode 22 is provided in the second seesaw piece 20b.

The first movable electrode 21 is a section of the movable body 20 overlapping the first fixed electrode 50, in plan view. The first movable electrode 21 and the first fixed electrode 50 form a capacitance C1. That is, the capacitance C1 is formed by the first movable electrode 21 and the first fixed electrode 50.

The second movable electrode 22 is a section of the movable body 20 overlapping the second fixed electrode 52, in plan view. The second movable electrode 22 and the second fixed electrode 52 form a capacitance C2. That is, the capacitance C2 is formed by the second movable electrode 22 and the second fixed electrode 52. In the physical quantity sensor 100, the movable body 20 is made of a conductive material (impurity-doped silicon), so that the movable electrodes 21 and 22 are provided. That is, the first seesaw piece 20a functions as a host for the first movable electrode 21, and the second seesaw piece 20b functions as a host for the second movable electrode 22.

The capacitance C1 and the capacitance C2 are configured so as to be equal to each other, for example, when the movable body 20 illustrated in FIG. 3 is in a horizontal state (e.g., parallel to the substrate 10). The positions of the movable electrodes 21 and 22 change depending on the movement of the movable body 20. The capacitances C1 and C2 change depending on the positions of the movable electrodes 21 and 22. A predetermined potential is applied to the movable body 20 through the support 30.

At least one through hole 25 penetrating the movable body 20 is formed in the movable body 20. Thus, it is possible to reduce the influence of air (air resistance) when the movable body 20 swings. Preferably, a plurality of through holes 25 are formed. In the illustrated example, the planar shape of each through hole 25 is a square.

An opening 26 penetrating the movable body 20 is formed in the movable body 20. The opening 26, if considered in a broad sense, is provided to span across the support axis Q in plan view. In the illustrated example, the overall planar shape of the opening 26 is rectangular. In more detail, the opening 26 includes two slots that are respectively C-shaped and backwards C-shaped and the two slots are provided as mirror images on either side of the support axis Q.

The support 30 is provided on the substrate 10. The support 30 is positioned in the opening 26. The support 30 supports the movable body 20 relative to the substrate 10. As illustrated in FIG. 2, the support 30 includes a first fixed portion 32 (a plate), a second fixed portion 34 (a plate), the first beam 41 (a cross beam), the second beam 42 (a cross beam), the third beam 43 (a torsional beam), and the fourth beam 44 (a torsional beam).

The first fixed plate 32 and the second fixed plate 34 are fixed to the substrate 10. The fixed plates 32 and 34 are provided so as to sandwich the support axis Q in plan view. In the illustrated example, the first fixed plate 32 is provided on the −X-axis direction side of the support axis Q, and the second fixed plate 34 is provided on the +X-axis direction side of the support axis Q. The fixed plates 32 and 34 are bonded to the top surface 14 of the post 13, as illustrated in FIG. 3.

As illustrated in FIG. 2, the first fixed plate 32 includes, for example, a base 32a having a rectangular shape in plan view and a protrusion 32b protruding from the base 32a toward the +X-axis direction side. In the illustrated example, two protrusions 32b are provided. The second fixed plate 34 includes, for example, a base 34a having a rectangular shape in plan view and a protrusion 34b protruding from the base 34a toward the −X-axis direction side. In the illustrated example, two protrusions 34b are provided.

The first beam 41 and the second beam 42 are spaced apart from the substrate 10. The beams 41 and 42 are connected to the first fixed plate 32 and the second fixed plate 34. In the illustrated example, the beams 41 and 42 each connect the base 32a with the base 34a. The beams 41 and 42 extend from the first fixed plate 32 to the second fixed plate 34, in a direction (for example, an orthogonal direction, in the illustrated example, the X-axis direction) intersecting the direction of the support axis Q (the extending direction of the support axis Q, in the illustrated example, the Y-axis direction). The beams 41 and 42 each have a planar shape that is longitudinally extended in the X-axis direction. The planar shapes of the beams 41 and 42 are, for example, rectangles. The beams 41 and 42 are spaced apart from each other. That is, an opening 36 in the support 30 separates the beams 41 and 42 from one another.

The third beam 43 is spaced apart from the substrate 10. The third beam 43 connects the first beam 41 with the movable body 20. The third beam 43 extends from the first beam 41 to the movable body 20 in the Y-axis direction. The third beam 43 axially extends along the support axis Q. The third beam 43 has a planar shape that is longitudinally extended in the Y-axis direction. The planar shape of the third beam 43 is, for example, a rectangle.

The fourth beam 44 is spaced apart from the substrate 10. The fourth beam 44 connects the second beam 42 with the movable body 20. The fourth beam 44 extends from the second beam 42 to the movable body 20 in the Y-axis direction. The fourth beam 44 axially extends along the support axis Q. The fourth beam 44 has a planar shape that is longitudinally extended in the Y-axis direction. The planar shape of the fourth beam 44 is, for example, a rectangle.

In the illustrated example, the movable body 20 includes a fifth beam 45 and a sixth beam 46. The beams 45 and 46 extend in the X-axis direction. The beams 45 and 46 each have a planar shape that is longitudinally extended in the X-axis direction. The planar shapes of the beams 45 and 46 are rectangles. The fifth beam 45 is provided on the +Y-axis direction side of the support 30. An opening 27 in the movable body 20 is adjacent the fifth beam 45. The sixth beam 46 is provided on the −Y-axis direction side of the support 30. An opening 28 in the movable body 20 is adjacent the sixth beam 46. The third beam 43 connects the first beam 41 with the fifth beam 45. The fourth beam 44 connects the second beam 42 with the sixth beam 46.

The first beam 41 is displaceable about an axis R1 intersecting (orthogonal in the illustrated example) the support axis Q. The second beam 42 is displaceable about an axis R2 orthogonal to the support axis Q. The fifth beam 45 is displaceable about an axis R3 orthogonal to the support axis Q. The sixth beam 46 is displaceable about an axis R4 orthogonal to the support axis Q. The beams 41, 42, 45, and 46 form torsion springs and can be torsionally deformed about the axes R1, R2, R3, and R4, respectively. The axes R1, R2, R3, and R4 are, for example, parallel to the X axis.

The third beam 43 and the fourth beam 44 are displaceable about the support axis Q. The beams 43 and 44 form torsion springs and can be torsionally deformed around the support axis Q. The beams 43 and 44 can have a strong restoring force against the torsional deformation occurring in the beams 43 and 44 as the movable body 20 swings like a seesaw.

In the illustrated example, the shortest distance D1 in the X-axis direction between the first fixed plate 32 and the third beam 43 is shorter than the shortest distance D2 in the X-axis direction between the first fixed plate 32 and a first connecting portion 41a of the first beam 41 where the first beam 41 joins the third beam 43. Further, the shortest distance D3 in the X-axis direction between the second fixed plate 34 and the third beam 43 is shorter than the shortest distance D4 in the X-axis direction between the second fixed plate 34 and the first connecting portion 41a.

Similarly, the shortest distance in the X-axis direction between the first fixed plate 32 and the fourth beam 44 may be shorter than the shortest distance in the X-axis direction between the first fixed plate 32 and a second connecting portion 42a of the second beam 42 where the second beam 42 joins the fourth beam 44. Further, the shortest distance in the X-axis direction between the second fixed plate 34 and the fourth beam 44 is shorter than the shortest distance in the X-axis direction between the second fixed plate 34 and the second connecting portion 42a.

The lengths (sizes in the Y-axis direction) of the third beam 43 and the fourth beam 44 are shorter than, for example, the lengths (sizes in the X-axis direction) of the first beam 41, the second beam 42, the fifth beam 45, and the sixth beam 46. The widths (sizes in the X-axis direction) of the beams 43 and 44 are smaller than, for example, the widths (sizes in the Y-axis direction) of the beams 41, 42, 45 and 46. The widths of the third beam 43 and the fourth beam 44 may be the same as the width of the opening in the Y-axis direction. The distance D1 may be shorter than a shortest distance in the Y-axis direction between the protrusion 32b and the first beam 41.

The movable body 20 and the support 30 are integrally provided as a monolithic structure. The material of the movable body 20 and the support 30 is, for example, silicon to which conductivity is imparted by doping impurities such as phosphorus and boron. In a case where the material of the substrate 10 is glass and the materials of the movable body 20 and the support 30 are silicon, the substrate 10 and the support 30 are bonded to each other by, for example, anodic bonding.

The first fixed electrode 50 and the second fixed electrode 52 are fixed to the substrate 10, as illustrated in FIG. 3. The fixed electrodes 50 and 52 are provided on the substrate 10. In the illustrated example, the fixed electrodes 50 and 52 are provided on the bottom surface 12 of the recess 11. The material of the fixed electrodes 50 and 52 is, for example, platinum, titanium tungsten, aluminum, gold, indium tin oxide (ITO), or the like.

The first fixed electrode 50 is provided on one side (in the example illustrated in FIG. 1, −X-axis direction side) of the support axis Q in plan view. The first fixed electrode 50 overlaps the first seesaw piece 20a in plan view. The first fixed electrode 50 is disposed to face the first movable electrode 21.

The second fixed electrode 52 is provided on the other side (in the example illustrated in FIG. 1, +X-axis direction side) of the support axis Q in plan view. The second fixed electrode 52 overlaps the second seesaw piece 20b in plan view. The second fixed electrode 52 is disposed to face the second movable electrode 22. In plan view, the area of the section overlapping the movable body 20 of the first fixed electrode 50 and the area of the section overlapping the movable body 20 of the second fixed electrode 52 are equal to each other, for example.

The first wiring 70 is provided on the substrate 10. The first wiring 70 connects the first pad 80 with the first fixed electrode 50. In the illustrated example, the first wiring 70 extends from the first pad 80 through the first groove 17 and the recess 11 to the first fixed electrode 50.

The second wiring 72 is provided on the substrate 10. The second wiring 72 connects the second pad 82 with the second fixed electrode 52. In the illustrated example, the second wiring 72 extends from the second pad 82 through the second groove 18 and the recess 11 to the second fixed electrode 52. The materials of the wirings 70 and 72 are, for example, the same as the material of the fixed electrodes 50 and 52.

The third wiring 74 is provided on the substrate 10. The third wiring 74 is electrically connected to the third pad 84 and the movable body 20 through the support 30. The third wiring 74 includes a wiring layer 74a and a bump 74b.

The wiring layer 74a of the third wiring 74 extends from the third pad 84 through the third groove 19 and the recess 11 to the bottom surface 16 of the hollow 15 as illustrated in FIG. 4. The material of the wiring layer 74a is, for example, the same as the materials of the fixed electrodes 50 and 52.

The bump 76b of the third wiring 74 is provided on the wiring layer 76a. The bump 74b connects the wiring layer 74a with the fixed plates 32 and 34 of the support 30. In the example illustrated in FIG. 2, four bumps 74b are provided. The first fixed plate 32 is connected to two bumps 74b. The second fixed plate 34 is connected to another two bumps 74b. The planar shape of each bump 74b is, for example, a rectangle. The material of each bump 76b is, for example, aluminum, gold, and platinum.

Although not shown, the first fixed plate 32 may be divided into two portions, one bump 74b may be connected to one first fixed plate 32, and the other bump 74b may be connected to the other first fixed plate 32. Similarly, the second fixed plate 34 may be divided into two portions, one bump 74b may be connected to one second fixed plate 34, and the other bump 74b may be connected to the other second fixed plate 34.

The lid 90 is provided on the substrate 10. The lid 90 is bonded to the substrate 10. The lid 90 and the substrate 10 form a cavity 92 for accommodating the movable body 20. The cavity 92 is, for example, established as an inert gas (for example, nitrogen gas) atmosphere. The material of the lid 90 is, for example, silicon. In a case where the material of the lid 90 is silicon and the material of the substrate 10 is glass, the substrate 10 and the lid 90 are bonded to each other by, for example, anodic bonding.

Next, the operation of the physical quantity sensor 100 will be described.

In the physical quantity sensor 100, the movable body 20 swings (pivots) about the support axis Q according to physical quantities such as acceleration and angular velocity. With the movement of the movable body 20, the distance between the first movable electrode 21 and the first fixed electrode 50, and the distance between the second movable electrode 22 and the second fixed electrode 52 change. Specifically, for example, when acceleration in the vertically upward direction (+Z-axis direction) is applied to the physical quantity sensor 100, the movable body 20 rotates counterclockwise, the distance between the first movable electrode 21 and the first fixed electrode 50 decreases, and the distance between the second movable electrode 22 and the second fixed electrode 52 increases. As a result, the capacitance C1 increases and the capacitance C2 decreases. Further, for example, when acceleration in the vertically downward direction (−Z-axis direction) is applied to the physical quantity sensor 100, the movable body 20 rotates clockwise, the distance between the first movable electrode 21 and the first fixed electrode 50 increases, the distance between the second movable electrode 22 and the second fixed electrode 52 decreases. As a result, the capacitance C1 decreases and the capacitance C2 increases.

In the physical quantity sensor 100, the capacitance C1 is detected using the pads 80 and 84, and the capacitance C2 is detected using the pads 82 and 84. Then, based on the difference between the capacitance C1 and the capacitance C2 (by a so-called differential detection method), it is possible to measure physical quantities such as the direction and magnitude of acceleration, angular velocity and the like.

As described above, the physical quantity sensor 100 can be used as an inertial sensor such as an acceleration sensor or a gyro sensor, and specifically, for example, can be used as a capacitive acceleration sensor that measures the acceleration in the vertical direction (Z-axis direction).

The physical quantity sensor 100 has, for example, the following features.

In the physical quantity sensor 100, the support 30 includes a first fixed plate 32 and a second fixed plate 34 which are fixed to the substrate 10 and provided so as to sandwich the support axis Q in plan view, a first beam 41 and a second beam 42 that each connect the first fixed plate 32 and the second fixed plate 34 and are spaced apart from each other; a third beam 43 that extends in a direction of the support axis Q and connects the first beam 41 and the movable body 20, and a fourth beam 44 that extends in the direction of the support axis Q and connects the second beam 42 with the movable body 20. Therefore, in the physical quantity sensor 100, in a case where a strong impact is applied in the Z-axis direction, the beams 41 and 42 can be torsionally deformed so as to bend. Thus, in the physical quantity sensor 100, in a case where a strong impact is applied in the Z-axis direction, it is possible to reduce stress concentration on the end on the first beam 41 side of the third beam 43 and the end on the second beam 42 side of the fourth beam 44 (mitigate stress concentration) (i.e., stress is mitigated from the proximal ends of the third and fourth beams 43 and 44). That is, the stress can be dispersed. Therefore, in the physical quantity sensor 100, the impact resistance in the Z-axis direction can be improved and the possibility of breaking the beams 43 and 44 can be reduced.

In the physical quantity sensor 100, the shortest distance D1 in the X-axis direction between the first fixed plate 32 and the third beam 43 is shorter than the shortest distance D2 in the X-axis direction between the first fixed plate 32 and the first connecting portion 41a, and the shortest distance D3 in the X-axis direction between the second fixed plate 34 and the third beam 43 is shorter than the shortest distance D4 in the X-axis direction between the second fixed plate 34 and the first connecting portion 41a. Therefore, in the physical quantity sensor 100, in a case of forming the movable body 20 and the support 30, the etching rate can be reduced by performing etching using an inductive coupling method (ICP) in order to form the third beam 43 having a predetermined width which is a target, that is, the progress of the side etching can be delayed, so that the third beam 43 having the predetermined width can be formed with this high precision etching. Since the third beam 43 defines the support axis Q for causing the movable body 20 to swing like the seesaw, it is preferable to reduce the rigidity. Therefore, the beams 43 and 44 are longer than the beams 41, 42, 45, and 46 and are smaller in width. The rigidity of the beam is inversely proportional to the cube of the width of the beam. Therefore, in order to reduce variations in the rigidity of the beams 43 and 44, it is desired to form the beams 43 and 44 with high accuracy.

For example, if the distance D1 is larger than the distance D2, and the distance D3 is larger than the distance D4, the etching rate for forming the third beam 43 is higher than the etching rate for forming the first beam 41. Then, in order to penetrate the material for forming the first beam 41, the material for forming the third beam 43 is overetched. Therefore, the third beam 43 may not be formed with high accuracy in some cases.

Similarly, in the physical quantity sensor 100, the shortest distance in the X-axis direction between the first fixed plate 32 and the fourth beam 44 is shorter than the shortest distance in the X-axis direction between the first fixed plate 32 and the second connecting portion 42a, and the distance in the X-axis direction between the second fixed plate 34 and the fourth beam 44 is shorter than the distance between the second fixed plate 34 and the second connecting portion 42a. Thus, the fourth beam 44 can be formed with high accuracy.

In the physical quantity sensor 100, the first beam 41 and the second beam 42 are displaceable about the axes R1 and R2. Therefore, in the physical quantity sensor 100, in a case where a strong impact is applied in the Z-axis direction, the beams 41 and 42 can be torsionally deformed about the axes R1 and R2.

In the physical quantity sensor 100, the movable body 20 includes the fifth beam 45 and the sixth beam 46 extending in the X-axis direction, the third beam 43 connects the first beam 41 with the fifth beam 45, and the fourth beam 44 connects the second beam 42 with the sixth beam 46. Therefore, in the physical quantity sensor 100, in a case where a strong impact is applied in the Z-axis direction, the beams 45 and 46 can be torsionally deformed. Thus, in the physical quantity sensor 100, in a case where a strong impact is applied in the Z-axis direction, it is possible to suppress stress concentration on the end on the fifth beam 45 side of the third beam 43 and the end on the sixth beam 46 side of the fourth beam 44. Therefore, in the physical quantity sensor 100, possibility of breaking the beams 43 and 44 can be reduced.

In the physical quantity sensor 100, the fifth beam 45 and the sixth beam 46 are displaceable about the axes R3 and R4. Therefore, in the physical quantity sensor 100, in a case where a strong impact is applied in the Z-axis direction, the beams 45 and 46 can be torsionally deformed about the axes R3 and R4.

In the physical quantity sensor 100, the widths (the lengths in the X-axis direction) of the third beam 43 and the fourth beam 44 are smaller than, for example, the widths (the lengths in the Y-axis direction) of the first beam 41, the second beam 42, the fifth beam 45, and the sixth beam 46. Therefore, in the physical quantity sensor 100, it is possible to reduce the rigidity of the beams 43 and 44 that define the support axis Q. In the physical quantity sensor 100, since the widths of the beams 41, 42, 45, and 46 are made larger than the widths of the beams 43 and 44 so as to have rigidity, the beams 41, 42, 45, and 46 are hardly damaged, and therefore the yield can be improved.

For example, in a case where the widths of the beams 41, 42, 45, and 46 are equal to or less than the widths of the beams 43 and 44, variation in the rigidity of the beams 41, 42, 45, and 46 increases due to process tolerance. Therefore, the yield may be deteriorated in some cases.

Although not shown, in the physical quantity sensor 100, a dummy electrode electrically connected to the movable body 20 may be provided in a region overlapping the movable body 20 in plan view of the bottom surface 12 of the recess 11. Thus, in the physical quantity sensor 100, it is possible to suppress sticking of the movable body 20 to the substrate (sticking).

2. Physical Quantity Sensor Manufacturing Method

Figure 5:
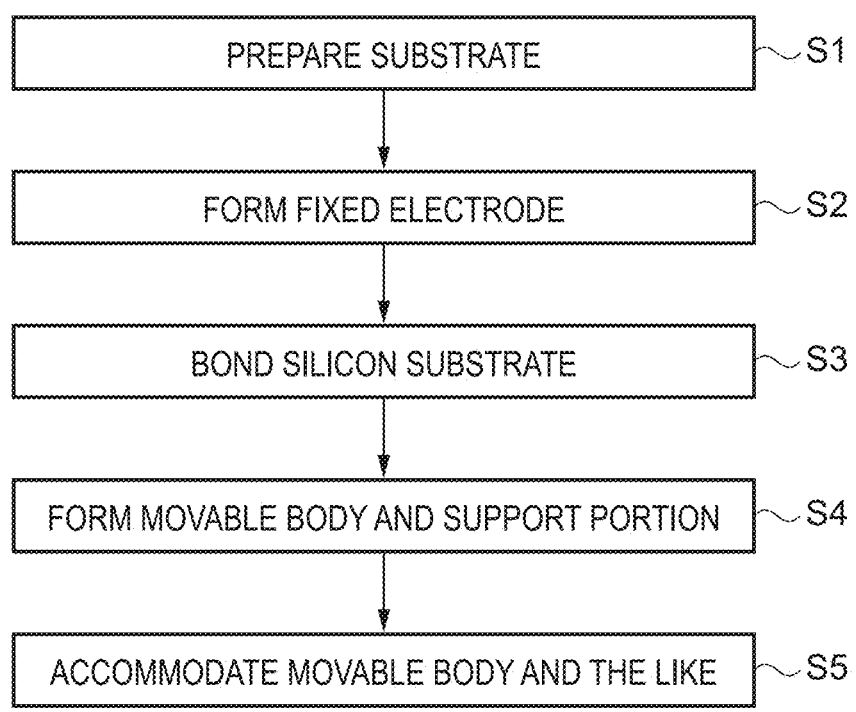
FIG. 5 is a flowchart for explaining a physical quantity sensor manufacturing method according to the present embodiment.
Figure 6:
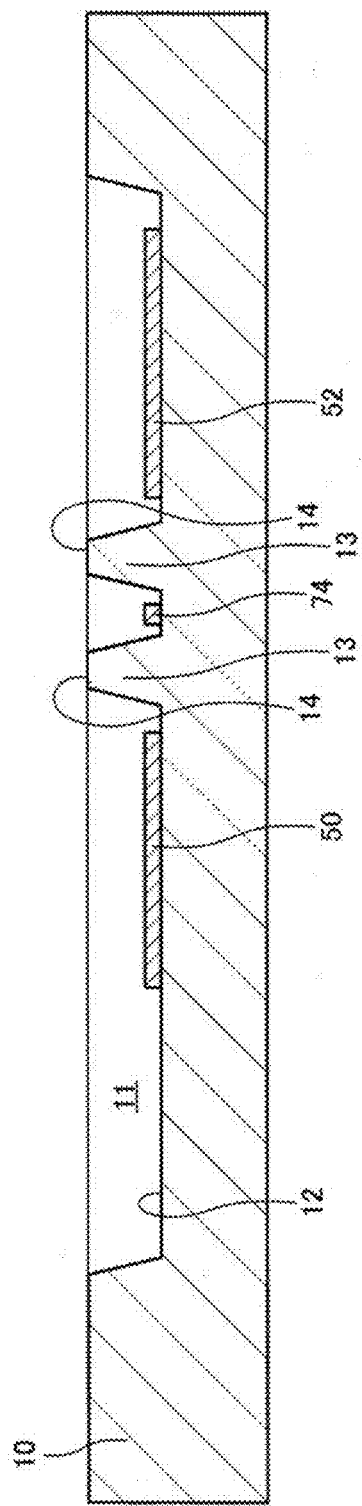
FIG. 6 is a cross-sectional view schematically illustrating the manufacturing process of the physical quantity sensor according to the present embodiment.
Figure 7:
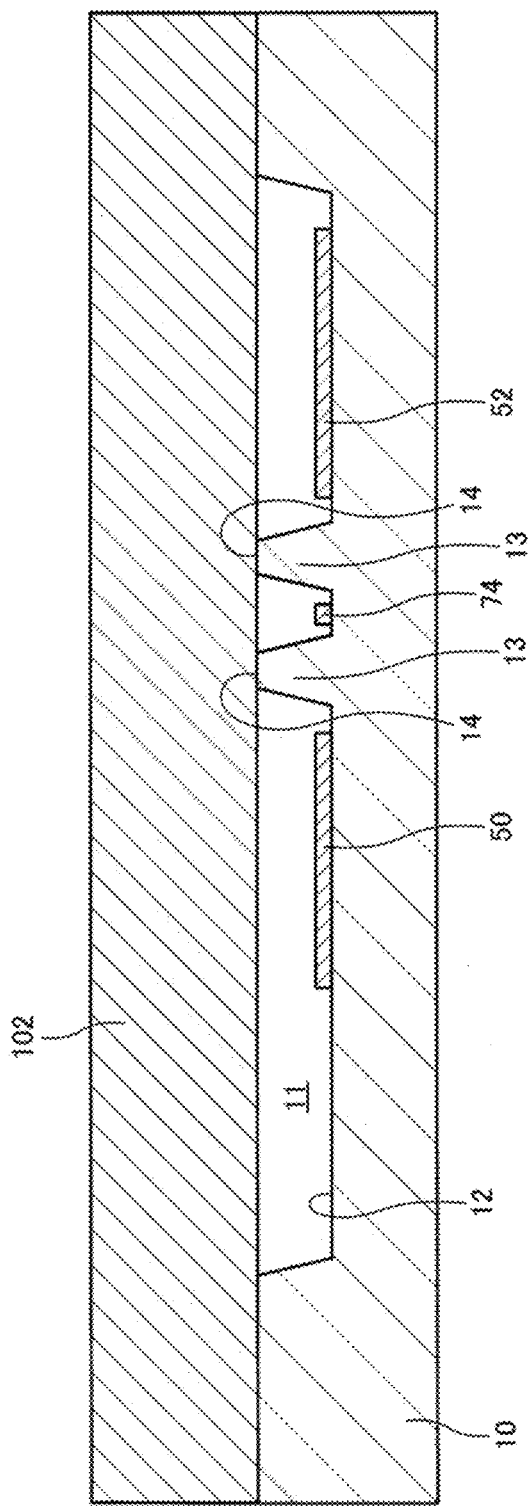
FIG. 7 is a cross-sectional view schematically illustrating the manufacturing process of the physical quantity sensor according to the present embodiment.
Figure 8:
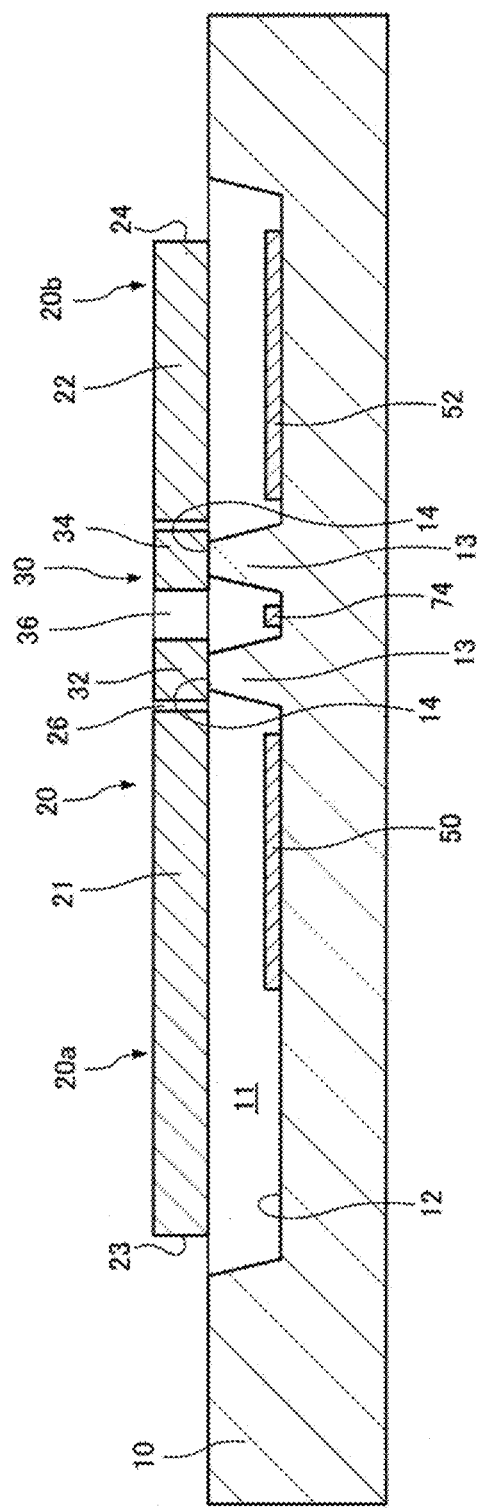
FIG. 8 is a cross-sectional view schematically illustrating the manufacturing process of the physical quantity sensor according to the present embodiment.

Next, a manufacturing method of the physical quantity sensor 100 according to the present embodiment will be described with reference to the drawings. FIG. 5 is a flowchart for explaining the manufacturing method of the physical quantity sensor 100 according to the present embodiment. FIG. 6, FIG. 7, and FIG. 8 are cross-sectional views schematically illustrating the manufacturing process of the physical quantity sensor 100 according to the present embodiment.

As illustrated in FIG. 6, a substrate 10 provided with a recess 11, a post 13 having a hollow 15, and grooves 17, 18, and 19 (see FIG. 1) is prepared, by patterning, for example, a glass substrate (step S1). The patterning is performed by, for example, photolithography and etching.

Next, fixed electrodes 50 and 52 are formed on the bottom surface 12 of the recess 11 (step S2). Next, wirings 70 and 72 and a wiring layer 74a are formed on the substrate 10 (see FIG. 1 and FIG. 4). Next, a bump 74b is formed on the wiring layer 74a (see FIG. 4). Thus, the third wiring 74 can be formed. The top surface of the bump 74b is formed so as to be positioned higher than the top surface 14 of the post 13. Next, pads 80, 82, and 84 are formed so as to be connected with the wirings 70, 72, and 74, respectively (see FIG. 1). In addition, the wirings 70 and 72 and the wiring layer 74a may be formed by the same process as that of the fixed electrodes 50 and 52.

The fixed electrodes 50 and 52, the wirings 70, 72, and 74, and the pads 80, 82, and 84 are formed by film formation and patterning by, for example, a sputtering method or a chemical vapor deposition (CVD) method. The patterning is performed by, for example, photolithography and etching.

As illustrated in FIG. 7, for example, a silicon substrate 102 is bonded to the substrate 10 (step S3). The bonding of the substrate 10 and the silicon substrate 102 is performed, for example, by anodic bonding. Thereby, the substrate 10 and the silicon substrate 102 can be firmly bonded. When bonding the silicon substrate 102 to the substrate 10, the silicon substrate 102 is depressed by being pushed by the bump 74b of the third wiring 74 (see FIG. 4). Thus, the silicon substrate 102 can be firmly connected to the bump 74b.

As illustrated in FIG. 8, the silicon substrate 102 is ground by, for example, a grinding machine to form a thin film, then, the thin film is patterned into a predetermined shape, and the movable body 20 and the support 30 are integrally formed (step S4). Patterning is performed by photolithography and etching (dry etching), and the Bosch method by an inductive coupling method can be used as a more specific etching technique.

As illustrated in FIG. 3, the lid 90 is bonded to the substrate 10, and the movable body 20 and the like are accommodated in the cavity 92 formed by the substrate 10 and the lid 90 (step S5). The bonding of the substrate 10 and the lid 90 is performed, for example, by anodic bonding. Thereby, the substrate 10 and the lid 90 can be firmly bonded to each other. By performing this process in an inert gas atmosphere, it is possible to fill the cavity 92 with an inert gas.

Through the above processes, the physical quantity sensor 100 can be manufactured.

3. Modification Example of Physical Quantity Sensor

3.1. First Modification Example

Figure 9:
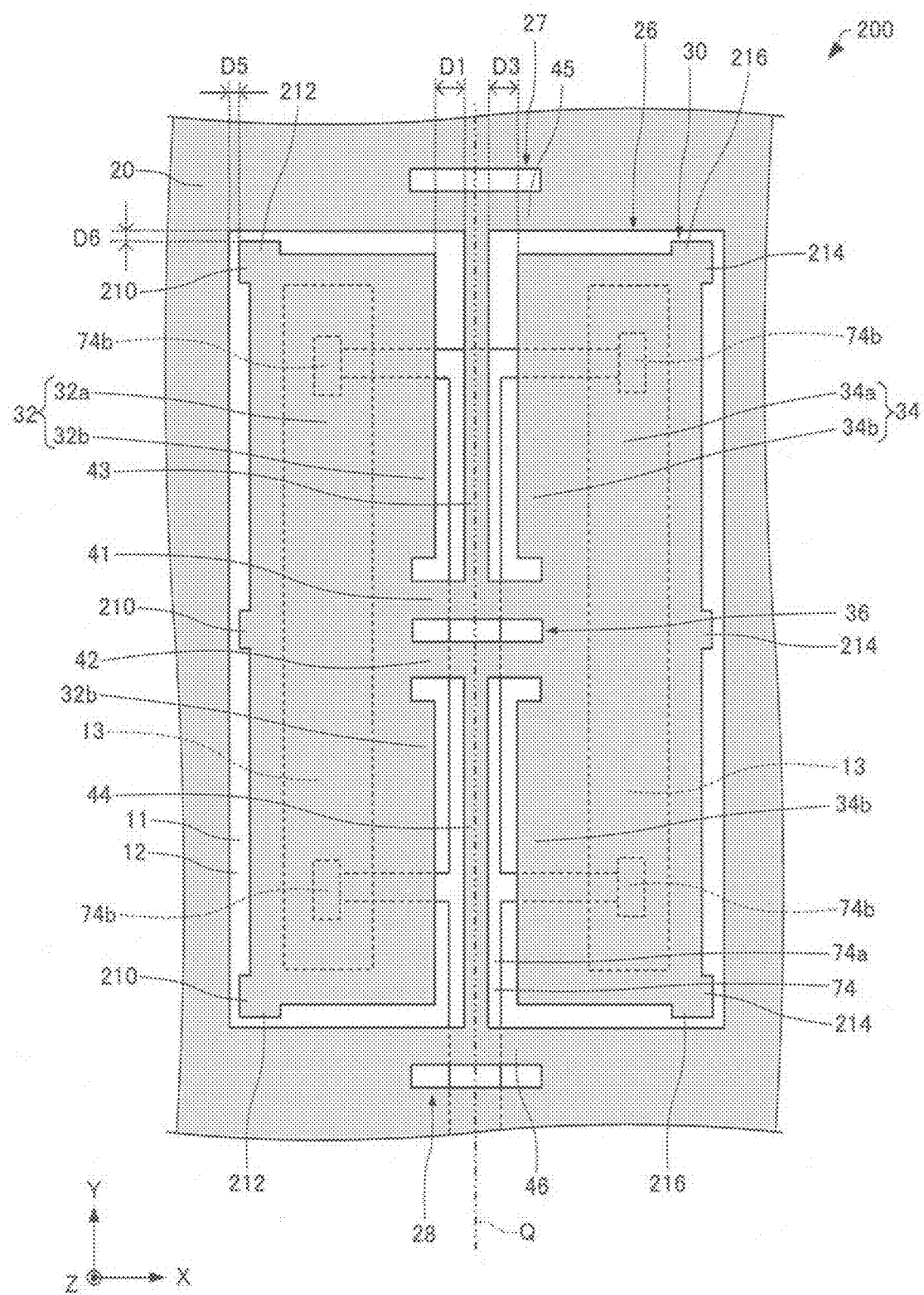
FIG. 9 is a plan view schematically illustrating the physical quantity sensor according to a first modification example of the present embodiment.

Next, a physical quantity sensor according to a first modification example of the present embodiment will be described with reference to the drawings. FIG. 9 is a plan view schematically illustrating a physical quantity sensor 200 according to the first modification example of the present embodiment. For the sake of convenience, illustration of the lid 90 is omitted in FIG. 9. In FIG. 9, the X axis, the Y axis, and the Z axis are illustrated as three axes orthogonal to each other.

In the following, in the physical quantity sensor 200 according to the first modification example of the present embodiment, members having the same functions as those of the constituent members of the above-described physical quantity sensor 100 are denoted by the same reference numerals, and a detailed description thereof will be omitted. This is the same in the physical quantity sensors according to the second modification example of the present embodiment to be described later.

The physical quantity sensor 200 differs from the physical quantity sensor 100 described above in that the support 30 includes a first stopper 210, a second stopper 212, a third stopper 214, and a fourth stopper 216, as illustrated in FIG. 9. In the illustrated example, the planar shapes of the stoppers 210, 212, 214, and 216 are rectangles.

The first stopper 210 protrudes from the first fixed plate 32 to the side opposite to the third beam 43 side in the X-axis direction. Specifically, the first stopper 210 protrudes from the first fixed plate 32 to the −X-axis direction side. In the illustrated example, the first stopper 210 is provided in the end on the +Y axis direction side, the end on the −Y axis direction side, and the center region of the first fixed plate 32.

The shortest distance D5 in the X-axis direction between the first stopper 210 and the movable body 20 is shorter than the shortest distance D3 in the X-axis direction between the second fixed plate 34 and the third beam 43. Similarly, the distance D5 may be shorter than a shortest distance in the X-axis direction between the second fixed plate 34 and the fourth beam 44.

The second stopper 212 protrudes from the first fixed plate 32 in the Y-axis direction. The second stopper 212 is provided at the end on the +Y-axis direction side and the end on the −Y-axis direction side of the first fixed plate 32. In the illustrated example, the second stopper 212 is provided integrally with the first stopper 210. Thus, the number of parts can be reduced.

The shortest distance D6 in the Y-axis direction between the second stopper 212 and the movable body 20 is shorter than the shortest distance D1 in the X-axis direction between the first fixed plate 32 and the third beam 43. Similarly, the distance D6 may be shorter than a shortest distance in the X-axis direction between the first fixed plate 32 and the fourth beam 44.

The third stopper 214 protrudes from the second fixed plate 34 in the X-axis direction. In the illustrated example, the third stopper 214 is provided at the end on the +Y-axis direction side, the end on the −Y-axis direction side, and the center part of the second fixed plate 34.

The shortest distance in the X-axis direction between the third stopper 214 and the movable body 20 is shorter than the shortest distance D1 in the X-axis direction between the first fixed plate 32 and the third beam 43. The shortest distance in the X-axis direction between the third stopper 214 and the movable body 20 is shorter than the shortest distance in the X-axis direction between the first fixed plate 32 and the fourth beam 44.

The fourth stopper 216 protrudes from the second fixed plate 34 in the Y-axis direction. The fourth stopper 216 is provided at the end on the +Y-axis direction side and the end on the −Y-axis direction side of the second fixed plate 34. In the illustrated example, the fourth stopper 216 is provided integrally with the third stopper 214. Thus, the number of parts can be reduced.

The shortest distance in the Y-axis direction between the fourth stopper 216 and the movable body 20 is shorter than the shortest distance D3 in the X-axis direction between the second fixed plate 34 and the third beam 43. Similarly, the shortest distance in the Y-axis direction between the fourth stopper 216 and the movable body 20 is shorter than the shortest distance in the X-axis direction between the second fixed plate 34 and the fourth beam 44.

The physical quantity sensor 200 can have the same effect as the physical quantity sensor 100 described above.

In the physical quantity sensor 200, the support 30 includes a first stopper 210 protruding from the first fixed plate 32 to the −X-axis direction side, and the shortest distance D5 in the X-axis direction between the first stopper 210 and the movable body 20 is shorter than the shortest distance D3 in the X-axis direction between the second fixed plate 34 and the third beam 43. Therefore, in the physical quantity sensor 200, even if a strong impact is applied and the movable body 20 and the third beam 43 are displaced to the +X axis direction side, before the third beam 43 collides with the second fixed plate 34, the movable body 20 collides with the first stopper 210. Therefore, in the physical quantity sensor 200, the possibility of breaking the third beam 43 can be reduced.

Similarly, in the physical quantity sensor 200, the distance D5 is shorter than a shortest distance in the X-axis direction between the second fixed plate 34 and the fourth beam 44. Therefore, in the physical quantity sensor 200, the possibility of breaking the fourth beam 44 can be reduced.

In the physical quantity sensor 200, the support 30 includes a second stopper 212 protruding from the first fixed plate 32 to the Y-axis direction side, and the shortest distance D6 in the Y-axis direction between the second stopper 212 and the movable body 20 is shorter than the shortest distance D1 in the X-axis direction between the first fixed plate 32 and the third beam 43. Therefore, in the physical quantity sensor 200, even if a strong impact is applied and the movable body 20 and the third beam 43 rotate counterclockwise about the Z axis, before the third beam 43 collides with the first fixed plate 32, the movable body 20 collides with the second stopper 212. Therefore, in the physical quantity sensor 200, the possibility of breaking the third beam 43 can be reduced.

Similarly, in the physical quantity sensor 200, the distance D6 is shorter than a shortest distance in the X-axis direction between the first fixed plate 32 and the fourth beam 44. Therefore, in the physical quantity sensor 200, even if a strong impact is applied and the movable body 20 and the fourth beam 44 rotate clockwise about the Z axis, before the fourth beam 44 collides with the first fixed plate 32, the movable body 20 collides with the second stopper 212. Therefore, in the physical quantity sensor 200, the possibility of breaking the fourth beam 44 can be reduced.

In the physical quantity sensor 200, the support 30 includes a third stopper 214 protruding from the second fixed plate 34 to the +X-axis direction side, and the shortest distance in the X-axis direction between the third stopper 214 and the movable body 20 is shorter than the shortest distance D1 in the X-axis direction between the first fixed plate 32 and the third beam 43. Therefore, in the physical quantity sensor 200, even if a strong impact is applied and the movable body 20 and the third beam 43 are displaced to the −X axis direction side, before the third beam 43 collides with the first fixed plate 32, the movable body 20 collides with the third stopper 214. Therefore, in the physical quantity sensor 200, the possibility of breaking the third beam 43 can be reduced.

Similarly, in the physical quantity sensor 200, the shortest distance in the X-axis direction between the third stopper 214 and the movable body 20 is shorter than the shortest distance in the X-axis direction between the first fixed plate 32 and the fourth beam 44. Therefore, in the physical quantity sensor 200, the possibility of breaking the fourth beam 44 can be reduced.

In the physical quantity sensor 200, the support 30 includes a fourth stopper 216 protruding from the second fixed plate 34 toward the Y-axis direction, and the shortest distance in the Y-axis direction between the fourth stopper 216 and the movable body 20 is shorter than the shortest distance D3 in the X-axis direction between the second fixed plate 34 and the third beam 43. Therefore, in the physical quantity sensor 200, even if a strong impact is applied and the movable body 20 and the third beam 43 rotate clockwise about the Z axis, before the third beam 43 collides with the second fixed plate 34, the movable body 20 collides with the fourth stopper 216. Therefore, in the physical quantity sensor 200, the possibility of breaking the third beam 43 can be reduced.

Similarly, the shortest distance in the Y-axis direction between the fourth stopper 216 and the movable body 20 is shorter than the shortest distance in the X-axis direction between the second fixed plate 34 and the fourth beam 44. Therefore, in the physical quantity sensor 200, even if a strong impact is applied and the movable body 20 and the fourth beam 44 rotate counterclockwise about the Z axis, before the fourth beam 44 collides with the second fixed plate 34, the movable body 20 collides with the fourth stopper 216. Therefore, in the physical quantity sensor 200, the possibility of breaking the fourth beam 44 can be reduced.

3.2. Second Modification Example

Figure 10:
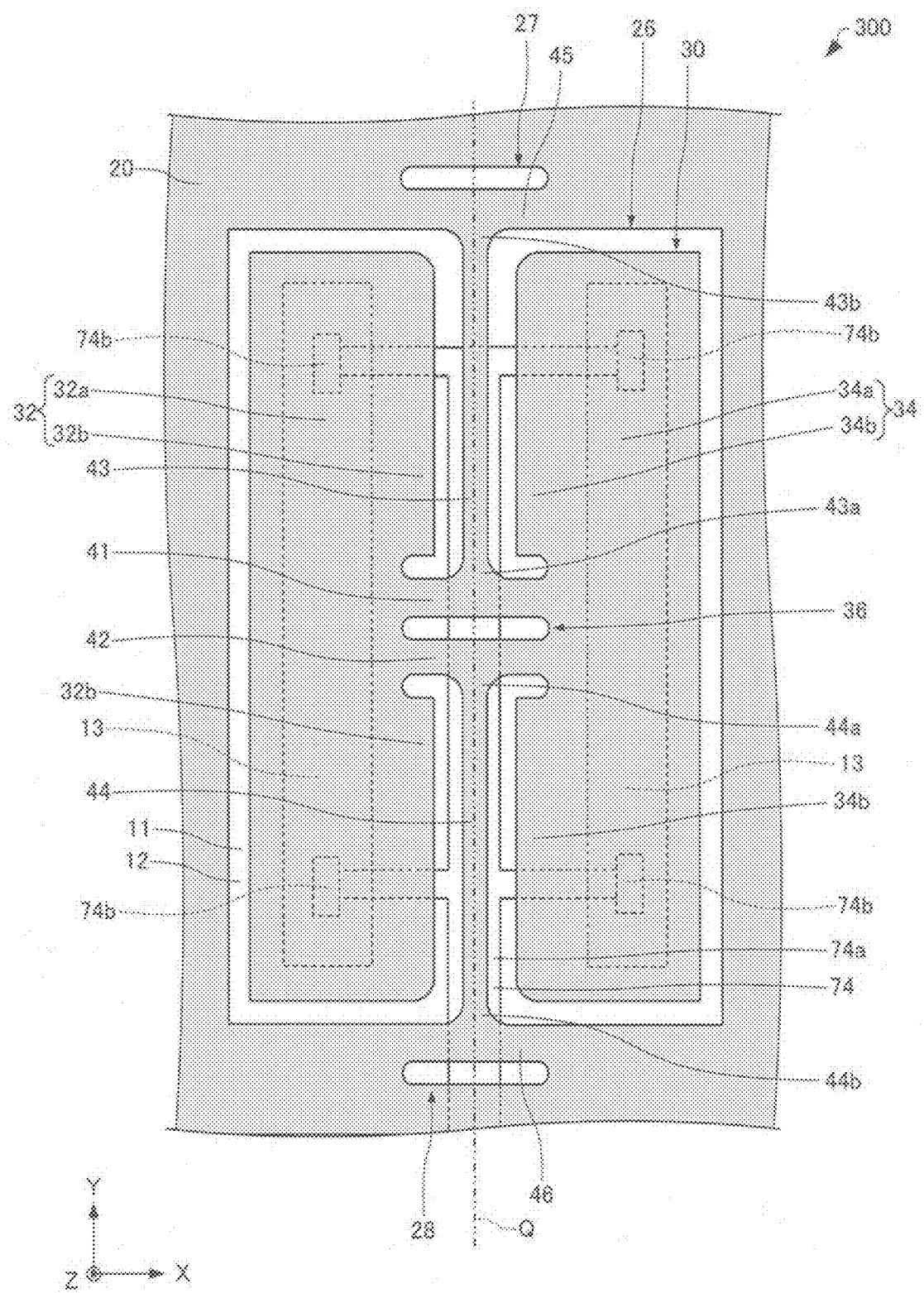
FIG. 10 is a plan view schematically illustrating the physical quantity sensor according to a second modification example of the present embodiment.

Next, a physical quantity sensor according to a second modification example of the present embodiment will be described with reference to the drawings. FIG. 10 is a plan view schematically illustrating a physical quantity sensor 300 according to the second modification example of the present embodiment. For the sake of convenience, illustration of the lid 90 is omitted in FIG. 10. In FIG. 10, the X axis, the Y axis, and the Z axis are illustrated as three axes orthogonal to each other.

In the physical quantity sensor 100 described above, as illustrated in FIG. 2, the planar shape of the third beam 43 is a rectangle. On the other hand, in the physical quantity sensor 300, as shown in FIG. 10, the third beam 43 includes width changing portions 43a and 43b (fillets) whose width gradually changes in plan view.

The width of the fillet 43a decreases toward the +Y-axis direction. The fillet 43a is connected to the first beam 41. The width of the fillet 43b decreases toward the −Y-axis direction. The fillet 43b is connected to the fifth beam 45. In plan view, the beams 41 and 43 do not form a sharp corner. In plan view, the beams 43 and 45 do not form a sharp corner. That is, the root of the third beam 43 does not form a sharp corner.

The fourth beam 44 includes width changing portions 44a and 44b (fillets) whose width gradually changes in plan view. The width of the fillet 44a decreases toward the −Y-axis direction. The fillet 44a is connected to the second beam 42. The width of the fillet 44b decreases toward the +Y-axis direction. The fillet 44b is connected to the sixth beam 46. In plan view, the beams 42 and 44 do not form a sharp corner. In plan view, the beams 44 and 46 do not form a sharp corner. That is, the root of the fourth beam 44 does not form a sharp corner.

Similarly, in plan view, the roots of the beams 41, 42, 45 and 46 do not form a sharp corner.

The physical quantity sensor 300 can have the same effect as the physical quantity sensor 100 described above.

In the physical quantity sensor 300, the width of the third beam 43 decreases toward the +Y-axis direction, and the third beam 43 includes a fillet 43a connected to the first beam 41, and a fillet 43b of which width decreases toward the −Y axis direction and which is connected to the fifth beam 45. That is, the root of the third beam 43 does not form a sharp corner. Therefore, in the physical quantity sensor 300, it is possible to suppress concentration of stress on the root of the third beam 43. Similarly, in the physical quantity sensor 300, it is possible to suppress concentration of stress on the roots of the beams 41, 42, 44, 45 and 46.

Although not shown, in the physical quantity sensor 300, the support 30 may include the stoppers 210, 212, 214, and 216, as in the physical quantity sensor 200 illustrated in FIG. 9. Note also that in this embodiment, the ends of the openings 27, 28 and 36, the ends of the notches adjacent to each of the protrusions 32b and 34b, and the inboard corners of the plates 32 and 34 are all rounded so that no sharp corners are formed in these locations.

4. Electronic Device

Figure 11:
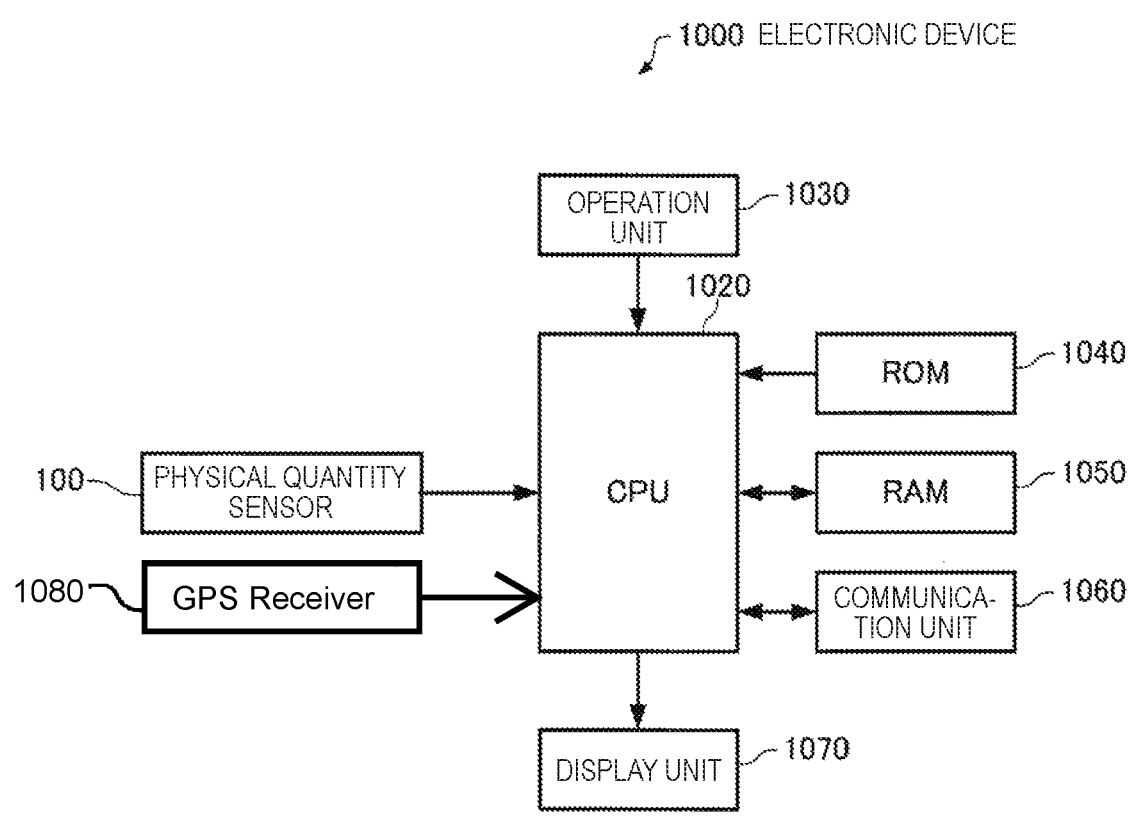
FIG. 11 is a functional block diagram of an electronic device according to the present embodiment.

Next, an electronic device according to the present embodiment will be described with reference to the drawings. FIG. 11 is a functional block diagram of the electronic device 1000 according to the present embodiment.

The electronic device 1000 includes the physical quantity sensor according to the invention. Hereinafter, a case where the physical quantity sensor 100 is included as a physical quantity sensor according to the invention will be described.

The electronic device 1000 is configured to further include an arithmetic/central processing unit (CPU) 1020 (processor), an operator 1030, a read only memory (ROM) 1040, a random access memory (RAM) 1050, a communication unit 1060 (an interface), and a display 1070. It is to be noted that the electronic device according to the present embodiment may be configured in such a manner that a part of the constituent elements (respective portions) in FIG. 11 is omitted or changed, or other constituent elements are added.

The arithmetic processor 1020 performs various calculation processes and control processes according to a program stored in the ROM 1040 or the like. Specifically, the arithmetic processor 1020 performs various processes according to the output signal of the physical quantity sensor 100, or the operation signal from the operator 1030, a process of controlling the interface 1060 for data communication with an external device, a process of transmitting a display signal for displaying various types of information on the display 1070, and the like.

The operator 1030 is an input device including an operation key, a button switch, and the like, and outputs an operation signal corresponding to an operation by a user to the arithmetic processor 1020.

The ROM 1040 stores programs, data, and the like for the arithmetic processor 1020 to perform various calculation processes and control processes.

The RAM 1050 is used as a work area of the arithmetic processor 1020 and temporarily stores programs and data read from the ROM 1040, data input from the physical quantity sensor 100, data input from the operator 1030, a calculation result obtained by the arithmetic processor 1020 executing various programs according to the instruction, and the like.

The interface 1060 performs various controls for establishing data communication between the arithmetic processor 1020 and the external device.

The display 1070 is a display device composed of a liquid crystal display (LCD) or the like, and displays various types of information based on a display signal input from the arithmetic processor 1020. A touch panel functioning as the operator 1030 may be provided in the display 1070.

Various electronic devices are conceivable as such an electronic device 1000, and examples include a personal computer (for example, a mobile type personal computer, a laptop type personal computer, a tablet type personal computer), a mobile terminal such as a smart phone and a mobile phone, a digital still camera, an inkjet type discharge device (for example, an ink jet printer), a storage area network device such as a router and a switch, a local area network device, a mobile terminal base station device, a television, a video camera, a video recorder, a car navigation device, a real time clock device, a pager, an electronic diary (with a communication function), an electronic dictionary, a calculator, an electronic game machine, a game controller, a word processor, a work station, a videophone, a security TV monitor, electronic binoculars, a POS terminal, medical equipment (for example, an electronic clinical thermometer, a blood pressure monitor, a blood glucose meter, an electrocardiogram measuring device, an ultrasonic diagnostic device, an electronic endoscope), a fish finder, various measuring instruments, meters and gauges (for example, instruments of a vehicle, an aircraft, and a ship), a flight simulator, a head mounted display, a motion trace, a motion tracking, a motion controller, a pedestrian position azimuth measurement (PDR), and the like.

Figure 12:
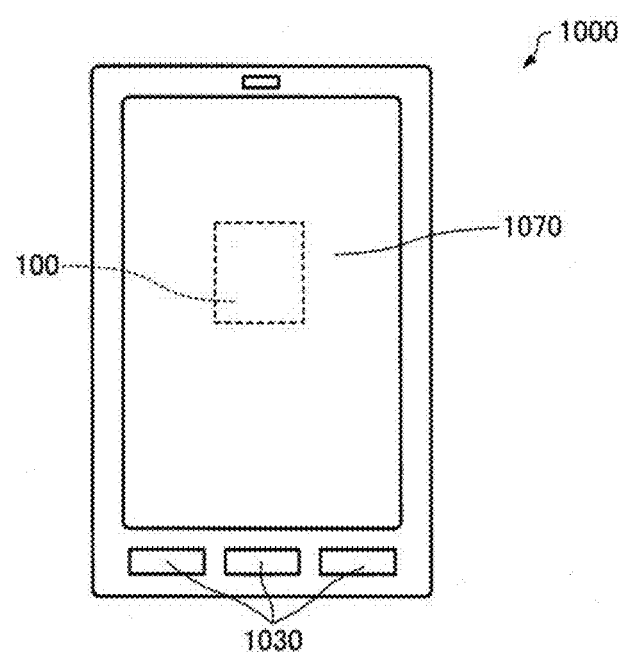
FIG. 12 is a view schematically illustrating an appearance of a smartphone which is an example of the electronic device according to the present embodiment.

FIG. 12 is a view illustrating an example of an external appearance of a smartphone which is an example of the electronic device 1000. A smartphone which is the electronic device 1000 includes a button as an operator 1030 and an LCD as the display 1070.

Figure 13:
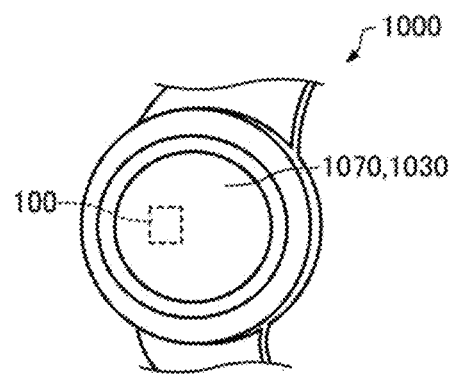
FIG. 13 is a view schematically illustrating an appearance of a wearable device which is an example of the electronic device according to the present embodiment.

FIG. 13 is a diagram illustrating an example of an appearance of a wrist-worn portable device (wearable device) which is an example of the electronic device 1000. The wearable device which is the electronic device 1000 includes an LCD as the display 1070. A touch panel functioning as the operator 1030 may be provided in the display 1070.

Further, the portable device, which is the electronic device 1000, includes a position sensor such as a Global Positioning System (GPS) receiver 1080, for example, and can measure a moving distance and a moving trajectory of the user.

5. Vehicle

Figure 14:
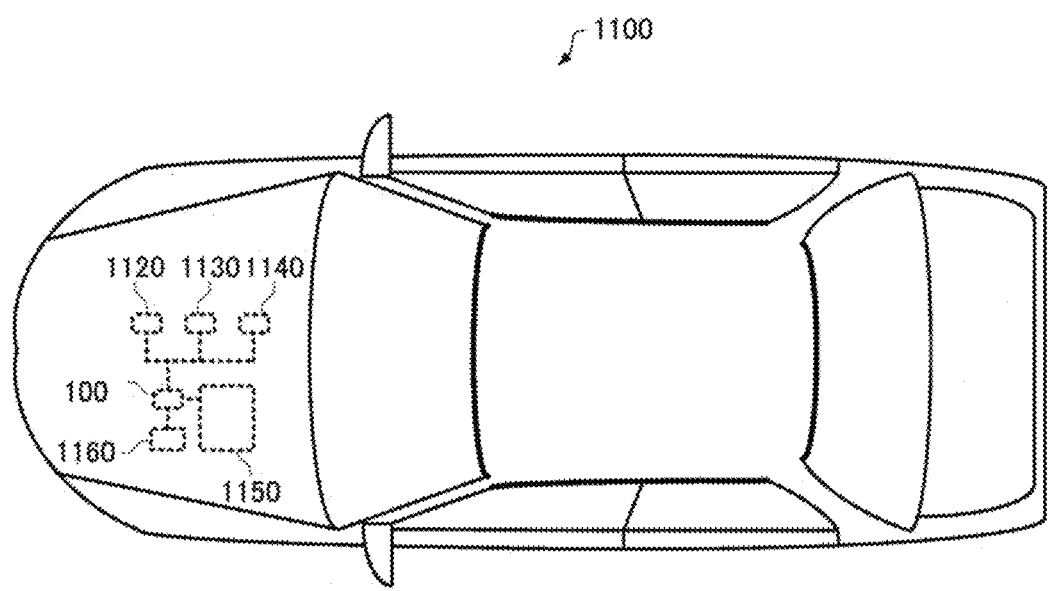
FIG. 14 is a plan view schematically illustrating a vehicle according to the present embodiment.

Next, a vehicle according to the present embodiment will be described with reference to the drawings. FIG. 14 is a perspective view schematically illustrating a car, as the vehicle 1100 according to the present embodiment.

The vehicle according to the present embodiment includes the physical quantity sensor according to the invention. Hereinafter, a vehicle including the physical quantity sensor 100 will be described as a physical quantity sensor according to the invention.

The vehicle 1100 according to the present embodiment is configured to further include a controller 1120 that controls an engine system, a brake system, a keyless entry system, and the like, a controller 1130, a controller 1140, a battery 1150, and a backup battery 1160. Note that, in the vehicle 1100 according to the present embodiment, a part of the constituent elements (each unit) illustrated in FIG. 14 may be omitted or changed, or other constituent elements may be added.

As such a vehicle 1100, various vehicles are conceivable, examples of which include an automobile (including an electric car), an aircraft such as a jet aircraft and a helicopter, a ship, a rocket, an artificial satellite, and the like.

Each of the above-described embodiments and modification examples is merely an example, and the invention is not limited thereto. For example, the respective embodiments and the respective modification examples can be appropriately combined.

Further, the invention includes substantially the same configuration (for example, configurations having the same function, method, and result, or configurations having the same purpose and effect) as the configuration described in the embodiment. Further, the invention includes configurations in which non-essential parts of the configuration described in the embodiment are replaced. Further, the invention includes configurations that achieve the same effect as the configuration described in the embodiment or configurations that can achieve the same object. Further, the invention includes configurations in which a well-known technology is added to the configuration described in the embodiment.

The entire disclosure of Japanese Patent Application No. 2017-061701 filed Mar. 27, 2017 is expressly incorporated by reference herein.

What is claimed is:

1. A physical quantity sensor comprising:
a substrate;
a movable body having an opening; and
a support disposed in the opening and supporting the movable body on the substrate,
wherein the support includes:
a first fixed plate and a second fixed plate that are fixed to the substrate, the first fixed plate and the second fixed plate each being a single, continuous plate;
a first beam and a second beam that each extend from the first fixed plate to the second fixed plate and are spaced apart from each other;
a third beam that extends from the first beam to the movable body; and
a fourth beam that extends from the second beam to the movable body,
wherein the movable body is displaceable about a rotation axis along which the third beam and the fourth beam extend.

2. The physical quantity sensor according to claim 1,
wherein a shortest distance between the first fixed plate and the third beam is shorter than a shortest distance between the first fixed plate and a connected portion of the first beam where the first bean is connected to the third beam, and
wherein a shortest distance between the second fixed plate and the third beam is shorter than a shortest distance between the second fixed plate and the connected portion.

3. The physical quantity sensor according to claim 1,
wherein the first beam and the second beam are pivotally displaceable.

4. The physical quantity sensor according to claim 1,
wherein the movable body includes, in plan view:
a first movable mass located on a first side of the rotation axis in a direction orthogonal to the rotation axis;
a second movable portion located on a second side of the rotation axis in the orthogonal direction; and
a fifth beam and a sixth beam that each extend from the first movable portion to the second movable portion,
wherein the fifth beam and the sixth beam extend laterally astride the opening,
wherein the third beam extends from the first beam to the fifth beam, and
wherein the fourth beam extends from the second beam to the sixth beam.

5. The physical quantity sensor according to claim 4,
wherein the fifth beam and the sixth beam are pivotally displaceable.

6. The physical quantity sensor according to claim 1,
wherein the first fixed plate includes a first stopper that projects along a first stopper axis from a first side of the first fixed plate, the first side being opposite to a second side of the first fixed plate along which the third beam extends, and
wherein a shortest distance between the first stopper and the movable body is shorter than a shortest distance between the second fixed plate and the third beam.

7. The physical quantity sensor according to claim 6,
wherein the first fixed plate includes a second stopper that projects along a second stopper axis from the first fixed plate, the second stopper axis being orthogonal to the first stopper axis, and
wherein a shortest distance between the second stopper and the movable body is shorter than a shortest distance between the first fixed plate and the third beam.

8. An electronic device comprising:
a physical quantity sensor;
an arithmetic processor configured to perform an arithmetic process based on an output signal from the physical quantity sensor; and
a display configured to display information according to control of the arithmetic processor,
wherein the physical quantity sensor includes
a substrate;
a movable body having an opening; and
a support disposed in the opening and supporting the movable body on the substrate,
the support includes
a first fixed plate and a second fixed plate that are fixed to the substrate;

a first beam and a second beam that each extend from the first fixed plate to the second fixed plate and are spaced apart from each other;

a third beam that extends from the first beam to the movable body; and a fourth beam that extends from the second beam to the movable body, and the movable body is displaceable about a rotation axis along which the third beam and the fourth beam extend.

9. The electronic device of claim 8, further comprising:

an interface configured to perform external data communication; and an input configured to transmit an operation signal to the arithmetic processor, wherein the electronic device is portable.

10. The electronic device according to claim 9, further comprising:

a GPS receiver, wherein the electronic device measures a movement distance and a movement trajectory of a user.

11. A physical quantity sensor comprising:

a substrate;

an H-shaped support mounted to the substrate, the support including first and second arms and a cross bar extending between the first and second arms, the first and second arms each being a single, continuous arm, the first and second arms each being fixed to the substrate, the cross bar including a longitudinal slot dividing the cross bar into first and second beams;

a movable body having an opening accommodating the support therein; and a pair of torsion beams respectively extending from proximal ends integral with the first and second beams to distal ends integral with the movable body, the pair of torsion beams supporting the movable body in a spaced apart relation from the substrate, each of the torsion beams being pivotally displaceable about a rotation axis along which the torsion beams longitudinally extend, wherein the movable body is displaceable about a rotation axis along which the pair of torsion beams extend.

12. The physical quantity sensor according to claim 11, wherein the first and second arms each include a transverse notch adjacent each of the first and second beams and extending parallel to the longitudinal slot.

13. The physical quantity sensor according to claim 12, wherein the movable body includes a secondary slot adjacent to the distal end of each of the torsion beams, each secondary slot extending orthogonal to the rotation axis.

14. The physical quantity sensor according to claim 11, wherein the movable body includes a secondary slot adjacent to the distal end of each of the torsion beams, each secondary slot extending orthogonal to the rotation axis.

15. The physical quantity sensor according to claim 11, further comprising:

a first stopper projecting along a first stopper axis from the first arm toward a wall of the opening and away from the rotation axis, the first stopper being closer to the wall than a shortest distance between the second arm and the torsion beams.

16. The physical quantity sensor according to claim 15, further comprising:

a second stopper projecting from the first arm along a second stopper axis, the second stopper axis being orthogonal to the first stopper axis, the second stopper being closer to the wall than a shortest distance between the first arm and the torsion beams.

17. A physical quantity sensor comprising:

a substrate;

an H-shaped support mounted to the substrate, the support including first and second arms and a cross bar extending between the first and second arms, the first and second arms each being a single, continuous arm;

a movable body having an opening accommodating the support therein;

a pair of torsion beams respectively extending from the cross bar to the movable body, the pair of torsion beams supporting the movable body in a spaced apart relation from the substrate, each of the torsion beams being pivotally displaceable about a rotation axis along which the torsion beams longitudinally extend; and stress mitigation slots provided adjacent junctions of the proximal and distal ends of the pair of torsion beams with the cross bar and the movable body, each of the stress mitigation slots extending orthogonal to the rotation axis, wherein the movable body is displaceable about a rotation axis along which the pair of torsion beams extend.

18. The physical quantity sensor according to claim 17, wherein the first and second arms each include transverse notches adjacent the cross beam and extending parallel to the stress mitigation slots.

19. The physical quantity sensor according to claim 17, further comprising:

a first stopper projecting along a first stopper axis from the first arm toward a wall of the opening and away from the rotation axis, the first stopper being closer to the wall than a shortest distance between the second arm and the torsion beams.

20. The physical quantity sensor according to claim 19, further comprising:

a second stopper projecting along a second stopper axis from the first arm, the second stopper axis extending orthogonal to the first stopper axis, and the second stopper being closer to the wall than a shortest distance between the first arm and the torsion beams.

* * * * *